United States Patent Office 3,846,258

Patented Nov. 5, 1974

3,846,258

PROCESS FOR SOLDER COATING SILICON SOLAR CELLS

Robert Walther Rostron, Washington, D.C., and Peter Ferenc Varadi, Rockville, Md., assignors to Communications Satellite Corporation, Washington, D.C.

No Drawing. Filed Dec. 30, 1971, Ser. No. 214,451
Int. Cl. C23b *5/32, 5/48*
U.S. Cl. 204—15 5 Claims

ABSTRACT OF THE DISCLOSURE

The electrical contact surface of silicon devices, particularly silicon solar cells, are coated with solder in an electroplating process.

BACKGROUND OF THE INVENTION

The invention is in the field of silicon device manufacturing techniques, and more particularly is an improved method for applying a solder coating to the electrical contact surfaces of a silicon solar cell.

One of the final manufacturing processes utilized in the production of silicon solar cells is the application of a thin coat of solder to the electrical contact surfaces. This solder coating ensures good electrical contact between the solar cell and the external electrical circuit and also provides humidity resistance for the metallic contacts of the cell. Solder coating is presently accomplished by dipping the solar cell into a highly purified molten solder bath, withdrawing it, and then wiping off the excess solder. This process must be carried out by hand and is extremely tedious and time consuming. Further, by the prior method referred to, the thickness of solder cannot be accurately controlled or readily measured. Each solar cell manufacturer performs the operation in a slightly different manner.

SUMMARY OF THE INVENTION

In accordance with the present invention, the above deficiencies of the prior art are overcome by electroplating solder onto the electrical contact surface of the silicon cells. The electroplating process will enable large numbers of cells to be coated simultaneously with an accurately determinable thickness of solder.

Although electroplating solder onto many surfaces is a well developed art, the technique of electroplating solder has heretofore not been successfully tried or used in connection with silicon devices. In view of the deficiencies of the prior art dip coating method and the advantages inherent in the electroplating process, it superficially appears quite unusual that the well developed art of electroplating has not previously been applied to solder coating electrical contact surfaces of silicon devices, particularly silicon solar cells. However, the electroplating bath used in the solder coating process is a fluoride solution and it is well known in the art that certain fluoride solutions are used to etch portions of a silicon surface.

DETAILED DESCRIPTION OF THE PREFERRED EMBODIMENTS

As pointed out above, both the electroplating process for coating a tin/lead solder onto a surface and the use of solder on silicon in accordance with the present invention, is as follows:

The volage-current characteristics of the cells were measured before and after plating. Each cell was first cleaned by a light scrub followed by a rinse and then by a cyanide dip followed by a rinser. The electrolite solution used for plating the cells was a "Meaker solder plating process" solution of known type, and the anode used was a 60/40 tin/lead alloy. Other conventional solder plating process solutions utilize a proper mixture of the lead and tin fluoroborate solution, which is described in F. A. Lowenheim, "Modern Electroplating," John Wylie & Sons, Second Edition. A typical composition of the lead fluoroborate solution is:

| | G./l. |
|---|---|
| Lead | 120–140 |
| Fluorboric Acid | 30–60 |
| Excess Boric Acid | 13–26 |
| Animal Glue | 0.2 |

The above constituents are dissolved in water. The Sn/Pb plating solution to produce the Sn/Pb alloy plating is chemically the same as that of lead solution with the addition of the tin fluoroborate. The proper amounts of the tin fluoborate concentrate can be added to the lead solution to obtain the desired tin concentration. For example, a typical bath composition is: 25 g./l. of tin, 225 g./l. lead, 40 g./l. of free fluoboric acid, 1 g./l. of glue, 2.5 amp./dm.$^2$. The result will be a 4% tin and 96% lead deposit. On the other hand, the resulting plating while utiliizng 60.5 g./l. tin, 26.7 g./l. of lead, 48 g./l. of free fluoboric acid, 5.1 g./l. of peptone, 5.5 amp/dm.$^2$ will result in 63% tin and 27% lead deposit. The "Meaker solder plating process" solution used in the examples mentioned herein basically utilizes a similar fluoroboric acid system, but it has possibly some additives (different than animal glue) to improve the plating quality.

The fluoroborate bath for the Sn/Pb solder plating could be replaced by sulfamate solutions but the fluoborate solution gives a much better quality, finer grained deposit than the sulfamate solutions.

A tin/nickel alloy plating may be used in place of the Sn/Pb alloy plating. An example of the former is described in the 39th Annual Edition of *Metal Finishing*, 1971, and utilizes a fluoride bath as in the Sn/Pb plating bath.

The alloy anodes used for the Pb/Sn solder plating are of approximately the same composition as the desired deposit. In the case of the tin/nickel alloy plating nickel anodes are used and the tin content is maintained by additions to the plating bath or by utilizing separate tin and nickel anodes which are connected to the same bus bar.

To provide the cathode for the electroplating process, during the manufacturing process of the silicon solar cell an extremely thin conductive coating comprising an evaporated titanium or chromium film with an evaporated or plated gold or silver layer is coated on certain areas of the surface of the solar cell. This thin conductive layer is the cathode on which the electroplated solder is deposited.

Several of the cells cited in accordance with the invention received a nickel "strike" before they were plated with the solder. The nickel "strike" was accomplished in an electrolite solution known in the trade as Sel Rex Electro Nic 1003. Five test cells were plated as follows:

| | |
|---|---|
| 1. 0.2 mils | Sn/Pb |
| 2. 0.2 mils | Sn/Pb |
| 3. 0.4 | Sn/Pb |
| 4. Ni strike +0.2 mils | Sn/Pb |
| 5. Ni Strike +0.2 mils | Sn/Pb |

All of the cells on the preceding page exhibited the same kind of voltage characteristics after plating as before except for the fifth test cell which shorted out. The plating time for the Sn/Pb averaged six minutes with about five minutes required for the nickel "strike." At this rate, it appears that the same number of cells which presently require about 300 man days to coat with solder could be electroplated with solder coating in about six man days.

What is claimed is:

1. In a process for manufacturing silicon semiconductor devices the improvement comprising electroplating a solder coating directly onto the electrical contact surfaces of said silicon devices, said electrical contact surfaces being metal layers having a top surface selected from the group consisting of gold, silver and nickel.

2. The process as claimed in claim 1 wherein said solder group consisting of gold, silver and nickel.
is a Sn/Pb solder.

3. The process as claimed in claim 2 wherein the step of electroplating comprises placing said devices in a fluoroborate electroplating bath along with a Sn/Pb alloy anode and applying a voltage difference to said anode and said devices.

4. The process as claimed in claim 3 wherein said fluoroborate plating bath comprises lead, tin, fluoroboric acid, and excess boric acid.

5. The process as claimed in claim 1 wherein said solder is a Sn—Ni solder.

References Cited

UNITED STATES PATENTS 3,625,837 12/1971 Nelson ............ 204—43 S

OTHER REFERENCES

Modern Electroplating, Second Edition, 1963, Edited by F. A. Lowenheim, pp. 249–253, 499–503.

*Plating,* B.F. Rothschild, April 1966, pp. 437–440.

THOMAS TUFARIELLO, Primary Examiner

U.S. Cl. X.R

204—43 S

UNITED STATES PATENT OFFICE
CERTIFICATE OF CORRECTION

Patent No. 3,846,258 Dated November 5, 1974

Inventor(s) Robert Walther ROSTRON et al

It is certified that error appears in the above-identified patent and that said Letters Patent are hereby corrected as shown below:

IN THE SPECIFICATION:

Column 1, line 67 - "volage" should be -- voltage --

Column 2, line 9 - "Fluroboric Acid" should be -- Fluoroboric Acid -- line 16 - "fluoborate" should be -- fluoroborate -- line 19 - "fluoborate" should be -- fluoroborate -- line 23 - "fluoborate" should be -- fluoroborate -- lines 31 and 32 - "fluoborate" should be -- fluoroborate --

IN THE CLAIMS:

Claim 2, Column 3, line 9 -- delete entire line

Signed and sealed this 18th day of March 1975.

(SEAL)
Attest:

RUTH C. MASON
Attesting Officer

C. MARSHALL DANN
Commissioner of Patents
and Trademarks